(12) United States Patent
Guillon

(10) Patent No.: US 7,352,164 B2
(45) Date of Patent: Apr. 1, 2008

(54) DEVICE FOR MEASURING AN ELECTRIC CURRENT

(76) Inventor: Jean-Louis Guillon, 16 rue du Pilet, 86440 Migne Auxance (FR)

( * ) Notice: Subject to any disclaimer, the term of this patent is extended or adjusted under 35 U.S.C. 154(b) by 0 days.

(21) Appl. No.: 10/754,090

(22) Filed: Jan. 7, 2004

(65) Prior Publication Data

US 2004/0183520 A1    Sep. 23, 2004

(30) Foreign Application Priority Data

Jan. 14, 2003   (FR) .................................. 03 00342

(51) Int. Cl.
  *G01R 19/00* (2006.01)
(52) U.S. Cl. ................................... 324/76.11
(58) Field of Classification Search .......... 324/117 R, 324/117 H, 126, 179, 246, 260, 207.2, 235, 324/252; 323/294, 368; 327/511; 336/173, 336/192
See application file for complete search history.

(56) References Cited

U.S. PATENT DOCUMENTS

| 4,492,919 A | 1/1985 | Milkovic | 1/20 |
| 6,252,389 B1 * | 6/2001 | Baba et al. | 324/117 H |
| 6,441,604 B1 * | 8/2002 | Gohara et al. | 324/117 R |
| 6,586,923 B2 * | 7/2003 | Seike | 324/117 H |
| 6,624,622 B2 * | 9/2003 | Noh | 324/72.5 |

FOREIGN PATENT DOCUMENTS

| EP | 0675368 | 10/1995 | .................. 21/8 |
| FR | 2800167 | 10/1999 | .................. 15/0 |
| FR | 2803914 | 7/2001 | .................. 15/18 |

* cited by examiner

*Primary Examiner*—Ha Tran Nguyen
*Assistant Examiner*—Tung X. Nguyen
(74) *Attorney, Agent, or Firm*—Sofer & Haroun, LLP

(57) ABSTRACT

The present invention relates to a device 1 for measuring an electric current and is particularly well adapted to electricity counters. This device 1 comprises a primary conductor 2 having a general U-shape, said primary conductor comprising a core 16 substantially circular in shape centred on an axis C, said central axis, and two branches, said first 19 and second 20 branches and a secondary winding 6 sensitive to a magnetic field, said secondary winding being disposed between said first 19 and second 20 branch of said primary conductor 2. Said primary conductor 2 is a flat profile folded in a U, said first branch 19 exhibiting torsion 13 of an angle of 90° according to a first direction of torsion and said second branch 20 exhibiting torsion 12 according to an angle of 90° along a second direction of torsion.

9 Claims, 4 Drawing Sheets

FIG_1
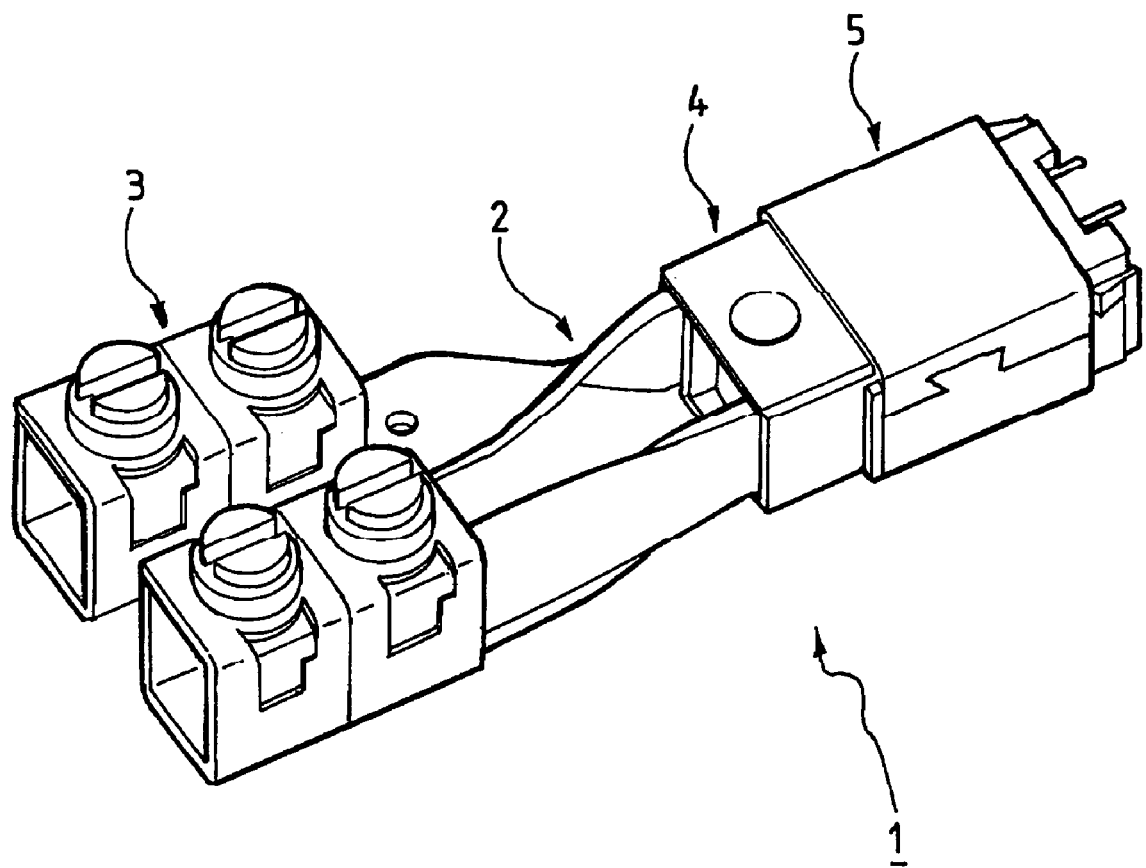

FIG_2
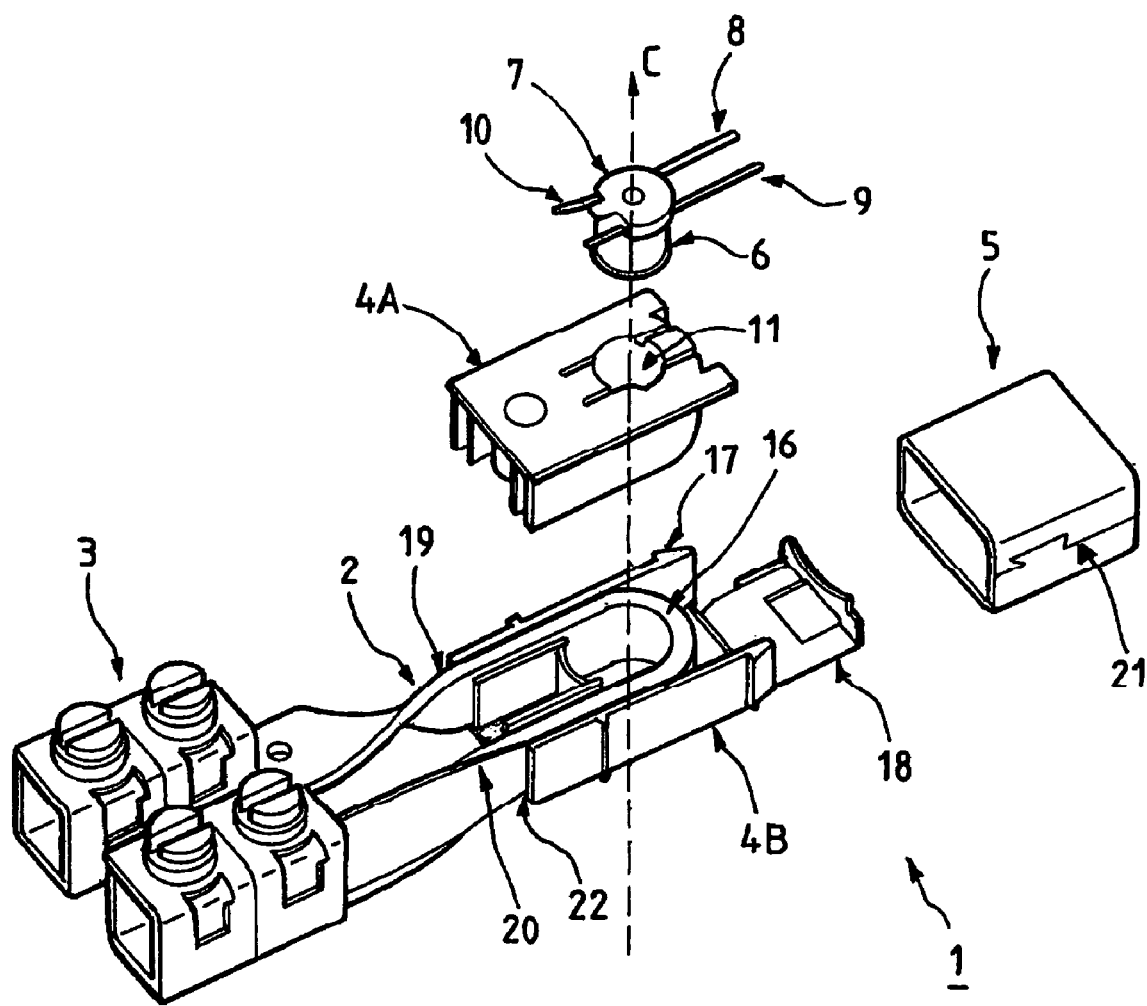

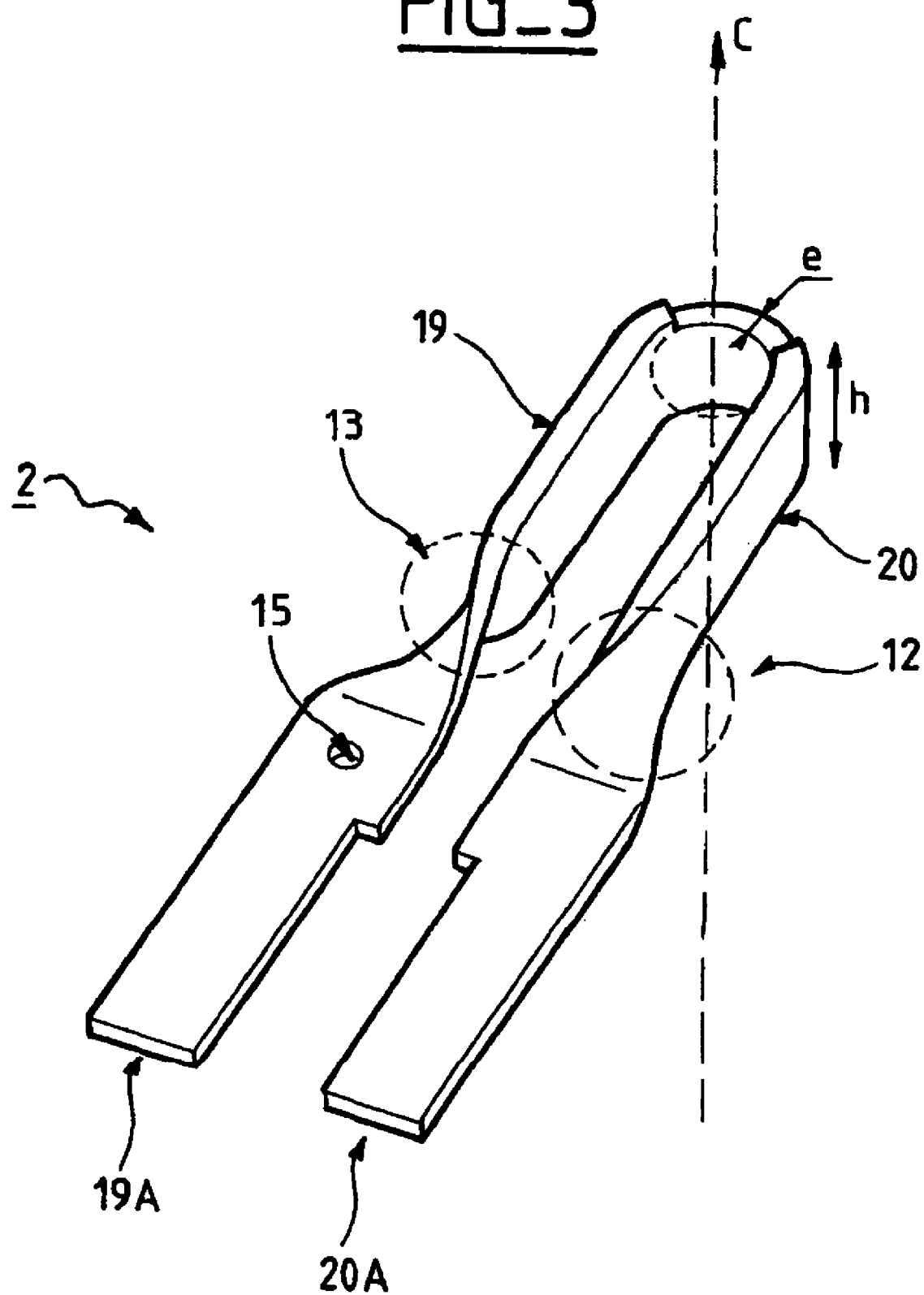

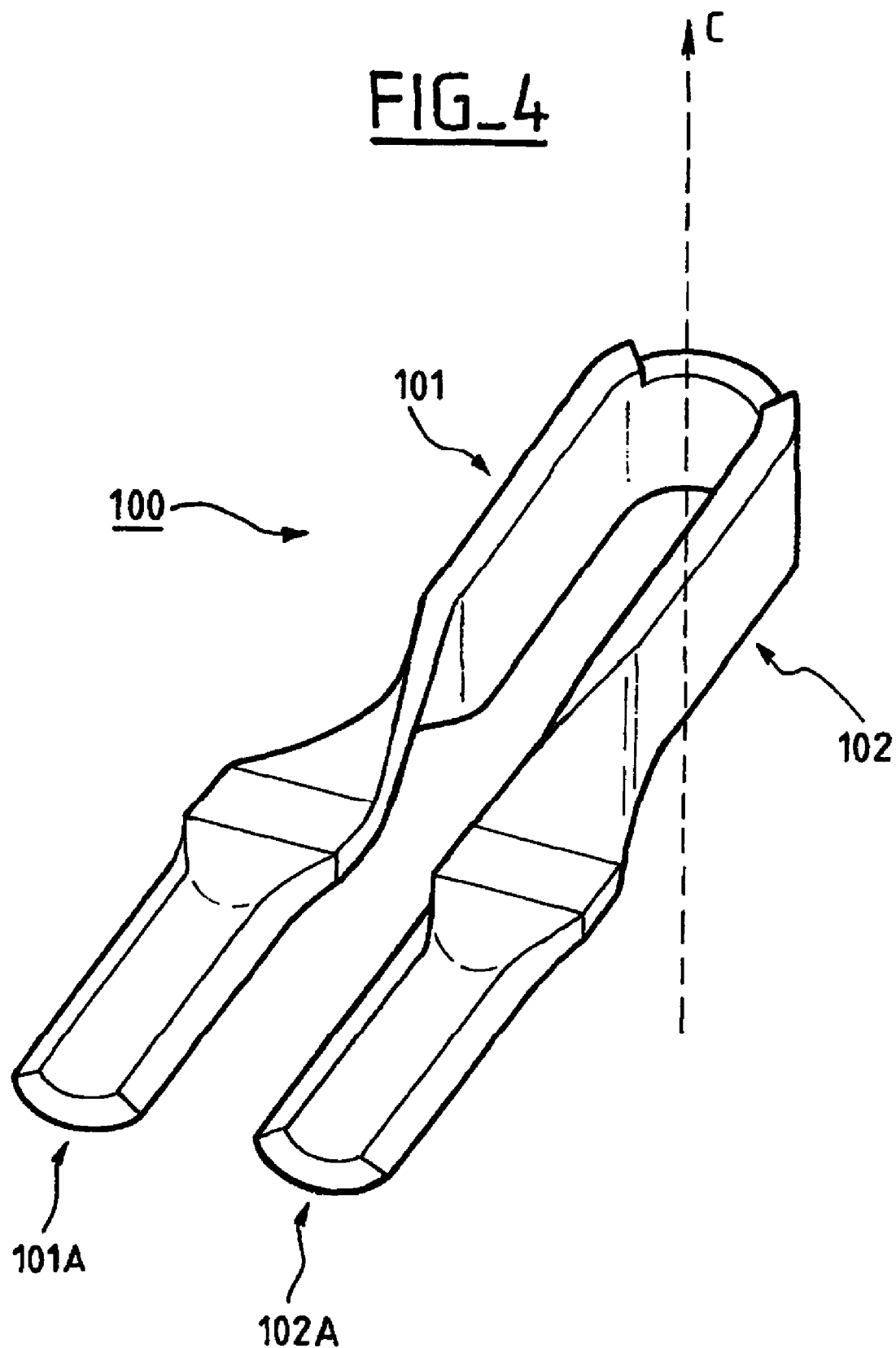

DEVICE FOR MEASURING AN ELECTRIC CURRENT

RELATED APPLICATION

This application is related to and claims the benefit of priority from French Patent Application No. 03 00342, filed on Jan. 14, 2003, the entirety of which is incorporated herein by reference.

FIELD OF THE INVENTION

The present invention relates to a device for measuring an electric current. This device is particularly well adapted to electricity counters.

BACKGROUND OF THE INVENTION

Several types of current sensors can be utilised in an electricity counter and are described in FR 2 800 167.

In particular, sensors with Hall effect are known, in which a Hall element is subjected to a magnetic field generated by a current in a primary winding. The Hall tension measured at the terminals of the Hall element is proportional to the current crossing this primary winding.

Another type of known sensor makes use of a transformer with mutual inductance. This type of sensor comprises for example a primary conductor having a the general form of an open U-shaped loop and a secondary winding sensitive to a magnetic field and wound on a winding placed inside the primary conductor. The secondary winding is subjected to a magnetic field generated by a current passing through the primary conductor, and the signal available at the terminals of the secondary conductor of the transformer is the image of the derivative as a function of the signal time applied to the primary. The primary conductor is a solid cylindrical conductor cable traversed by the current to be measured and whereof the ends are fixed in contact terminals situated on the counter.

The latter solution poses certain difficulties, however.

Therefore, in the case of an increased measuring current, the diameter of the primary cable must be relatively significant to cause an increase in the section of the cable. This raised section causes augmentation in size, especially in width, and overall cost of the current sensor.

In addition, because the electricity counters are becoming smaller and smaller, it is likewise necessary to make the current sensors as compact as possible.

In addition, there are different types of contact terminals allowing the counter to be connected to the ends of the primary conductor. The different forms of these terminals necessitate modifying the structure of the primary cable, which is fairly difficult to handle due to its solid cylindrical form.

OBJECTS AND SUMMARY OF THE INVENTION

The aim of the present invention is to provide a device for measuring an electric current of reduced size and cost, permitting easy adaptation to all types of terminals utilised in electric counters without causing constraints to the secondary winding while the ends of the primary conductor are clamped in or on the terminals.

To this end the present invention proposes a device for measuring an electric current comprising:
- a primary conductor having a general U-shape, said primary conductor comprising a core substantially circular in shape and centred on an axis, said central axis, and two branches, said first and second branches,
- a secondary winding sensitive to a magnetic field, said secondary winding being placed between said first and second branch of said primary conductor, characterised in that said primary conductor is a flat profile folded in a U, said first branch exhibiting torsion of an angle of 90° in a first direction of torsion and said second branch exhibiting torsion according to an angle of 90° in a second direction of torsion. Due to the invention, the primary conductor is realised by means of a flat profile made of a conductive material whereof the section is selected to allow the measuring current to pass through. The fact of using a flat profile folded in a U instead of a solid cylindrical conductor results in a decrease in the overall width of the device and thus results in the most compact measuring device possible.

In addition, this compactness helps limit the quantity of material utilised to create the shielding surrounding the primary and secondary parts of the device. This shielding made of a material such as mumetal is particularly costly.

In addition, it is easy to handle the branches of the flat profile folded in a U, as well as the ends of these branches, so as to have them take adequate shape to re-establish contact with the different types of counter terminals.

Finally, it is important to have the two branches of the outputs of the primary conductor symmetrical relative to a plane of symmetry (one twisted to the left and the other twisted to the right or vice versa). The two torsions in inverse direction effectively enable the two branches of the primary conductor to be brought together locally, so as to enclose the secondary winding as closely as possible. The primary conductor exiting from a production tool has geometric faults, which must be located in a geometric tolerance. Gripping the two branches, whether on terminals, or in terminals, in the presence of a fault, causes the resulting constraint to remain in the plane of symmetry and not be able to displace the secondary winding or deform the shielding. It is very important to be able to maintain au montage then in the temps the respective position of each of the constituents of the device without a constraint on the primary conductor modifying this position.

Advantageously, when the two branches have torsion in accordance with a first embodiment, the end of each of said first and second branches is plane.

Therefore, based on a flat vertical profile, two branches having plane ends horizontally are obtained. These plane horizontal ends are particularly useful for penetrating into said folded terminals, which are terminals of substantially parallelepipedic shape. When the primary conductor is a solid cable, it is necessary to crush the end of the conductor in order to insert it into this type of terminal.

These horizontally plane ends can also be fastened by screwing onto the upper part of certain terminals.

Advantageously, when the two branches have torsion and in accordance with a second embodiment, the end of each of said first and second branches has a semi-cylindrical form.

Therefore, these ends of semi-cylindrical form are particularly useful for penetrating into terminals having cylindrical openings for making electrical contact. Advantageously, said secondary winding is substantially centred on said central axis. Advantageously, the device comprises shielding provided for magnetic insulation of the whole formed by said primary conductor and said primary winding.

Advantageously, said shielding is a band doubled so as to form a ring of substantially parallelepipedic form enclosing said primary conductor and said secondary winding. Advantageously, the device comprises a bobbin on Which is wound said secondary winding and said bobbin of secondary winding comprises electrical contact means, said electrical contact means being folded so as to establish electrical contact between said shielding and a single end of said secondary winding.

Said electrical contact means are for example made by way of a single conductive rod having a folded end for making contact with the shielding.

Advantageously, the device comprises electric insulation means of said primary conductor and of said secondary winding, said insulation means comprising a receptacle located inside said primary conductor and centred on said central axis for receiving said secondary winding.

Therefore, there is good electric insulation between the primary conductor and the secondary winding, at the same time ensuring centring of the secondary winding. Advantageously, the device comprises shielding provided for magnetic insulation of the ensemble formed by said primary conductor and said secondary winding and said insulation means are covered by said shielding and comprise means for keeping said shielding fixed.

Therefore, it is not necessary to individually insulate the principal conductor, with the shielding being separated from said principal conductor by said insulation means. This type of individual insulation of the principal conductor does, however, pose certain problems, in that it requires the insulation to be removed at the ends of the conductor making contact with the terminals of the counter; thanks to the invention, this operation is eliminated.

BRIEF DESCRIPTION OF THE DRAWINGS

Other characteristics and advantages of the present invention will emerge from the following description of embodiments of the invention, given by way of illustration and in no way limiting, in which:

FIG. 1 illustrates a global view of a device according to the present invention, FIG. 2 illustrates an exploded view of a device according to the present invention, FIG. 3 illustrates a first embodiment of a primary conductor utilised in a device according to the present invention, FIG. 4 illustrates a second embodiment of a primary conductor utilised in a device according to the present invention.

DETAILED DESCRIPTION

In all figures, the common elements are designated by the same reference numerals.

FIG. 1 illustrates a global view of a device 1 for measuring an electric current according to the present invention.

The device 1 will be described in greater detail in reference to FIG. 2, which illustrates an exploded view of this same device 1.

The device 1 comprises:
 a primary conductor 2,
 a secondary winding 6,
 shielding 5,
 electric insulation means 4.

The primary conductor 2 is a flat profile folded in a U, such as shown in FIG. 3. The flat profile has for example a thickness e of around 2 mm and a height h around 10 mm for a maximum measuring current of 120 A. It is made of electrolytic copper, for example.

The primary conductor 2 comprises:
 a first branch 19 having an end 19A,
 a second branch 20 having an end 20A,
 a substantially circular core 16 centred on an axis C, said central axis.

The first branch 19 has torsion 13 of 90° in the inverse direction to the trigonometric direction, such that its end 19A is plane horizontally.

The second branch 20 has torsion 12 of 90° in the trigonometric direction, such that its end 20A is plane horizontally and the two branches 19 and 20 are brought together locally at torsions 13 and 12.

The plane horizontal ends 20A and 19A such as shown in FIG. 3 penetrate by making electrical contact in a horizontal position in said folded terminals 3, which are terminals of substantially parallelepipedic form, such as shown in FIGS. 1 and 2. These terminals 3 belong to an electricity counter, not shown here. It should be noted that the plane ends 20A and 19A each also comprise a hole 15 allowing these ends to be fixed by screwing onto adapted terminals.

In reference to FIG. 2, the secondary winding 6 is a wire winding, for example of a thickness of 63 Ilm, wound on a casing or bobbin 7, whereof the diameter is around 8.4 mm and whereof the height is 9 mm. Two electrical contact rods 8 and 9 traverse the casing 7. The end 10 of the rod 8 is cambered upwards so as to make contact with the shielding 5.

The electric insulation means 4 comprise two shells 4A and 4B, upper and lower respectively, made of polypropylene. The upper shell 4A comprises a receptacle 11 situated inside the primary conductor 2 and centred on the central axis C for receiving the secondary winding 6. The lower shell 4B comprises grooves 22 in which the branches 19 and 20 of the primary conductor 2 come to rest.

The two shells 4A and 4B enclose the primary conductor 2 so as to insulate it electrically from the rest of the device 1; they centre and immobilise the secondary winding 6 wound onto the casing 7 at the centre of the circular core 16 of the primary conductor 2.

The shielding 5 is a ring of substantially parallelepipedic form. It is slid onto the shells 4A and 4B and immobilises the secondary winding 6. The shielding 5 is created by means of a band of Mumetal doubled over and stapled by a rounded tail 21. The lower shell 4B comprises harpoons 17 allowing the shielding 5 and a cover 18 to be immobilised.

As the shielding 5 is introduced, the latter passes over the two harpoons 17 by deforming the shell 4B; once the shielding 5 is in place, the two harpoons 17 resume their initial position and prevent the shielding 5 from rising. In order to immobilise the two harpoons 17 and be sure that, in spite of shock, the shielding 5 will remain in place, the cover 18 is closed and effectively prevents the harpoons 17 from pushing back.

FIG. 3 illustrates a first embodiment of a primary conductor used in a device according to the present invention, and has already been described in relation to FIGS. 1 and 2.

FIG. 4 illustrates a second embodiment of a primary conductor 100 used in a device according to the present invention.

The primary conductor 100 is identical to the primary conductor such as shown in FIG. 3, with the difference that its two branches 101 and 102 each have an end 101A and 102B having a semi-cylindrical shape.

These ends 101A and 102B of semi-cylindrical shape are particularly useful for penetrating into terminals having openings cylindrical in order to make electrical contact with a counter.

Of course, the invention is not limited to the particular embodiments described hereinabove.

In particular, the shape of the ends of the branches of the primary conductor has been described as being plane or semi-cylindrical, though other shapes, which can be adapted to other types of terminals, are also feasible.

The invention claimed is:

1. A device for measuring an electric current comprising:
    a primary conductor having a general U-shape, said primary conductor comprising a core of substantially circular shape centred on an axis (C) and two first and second branches;
    a secondary winding sensitive to a magnetic field, said secondary winding being placed between said first and second branch of said primary conductor, wherein said primary conductor is a flat profile folded in a U-shape, said first branch having torsion of an angle of 90° in a first direction of torsion and said second branch having torsion according to an angle of 90° in a second opposite direction of torsion so that said first branch and second branch are brought together locally so as to enclose said secondary winding as closely as possible.

2. The device as claimed in claim 1, wherein the ends of each of said first and second branches is plane.

3. The device as claimed in claim 1, wherein the ends of each of said first and second branches has a semi-cylindrical form.

4. The device as claimed in claim 1, wherein said secondary winding is substantially centred on said central axis (C).

5. The device as claimed in claim 1, further comprising shielding, provided for the magnetic insulation of the ensemble formed by said primary conductor and said primary winding.

6. The device as claimed in claim 5, wherein said shielding is a band doubled over so as to form a ring of substantially parallelepipedic form enclosing said primary conductor and said secondary winding.

7. The device as claimed in claim 5, further comprising a bobbin on which is wound said secondary winding, and in that said bobbin of secondary winding comprises electrical contact means, said electrical contact means being folded so as to establish electrical contact between said shielding and a single end of said secondary winding.

8. The device as claimed in claim 1, further comprising an electric insulation means of said primary conductor and of said secondary winding, said insulation means comprising a receptacle located inside said primary conductor and centred on said central axis (C) for receiving said secondary winding.

9. The device as claimed in claim 8, further comprising a shielding provided for the magnetic insulation of the ensemble formed by said primary conductor and said secondary winding, and in that said insulation means are covered by said shielding and comprise means for keeping said shielding fixed.

* * * * *